United States Patent
Chen et al.

(10) Patent No.: US 12,527,223 B2
(45) Date of Patent: Jan. 13, 2026

(54) PIEZOELECTRIC DEVICE WITH HYDROGEN GETTER

(71) Applicant: Taiwan Semiconductor Manufacturing Company, Ltd., Hsinchu (TW)

(72) Inventors: Chih-Ming Chen, Hsinchu (TW); Chung-Yi Yu, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/650,162

(22) Filed: Apr. 30, 2024

(65) Prior Publication Data

US 2024/0292757 A1    Aug. 29, 2024

Related U.S. Application Data

(60) Continuation of application No. 17/852,970, filed on Jun. 29, 2022, now Pat. No. 12,010,918, which is a division of application No. 16/108,384, filed on Aug. 22, 2018, now Pat. No. 11,527,702.

(60) Provisional application No. 62/696,471, filed on Jul. 11, 2018.

(51) Int. Cl.
*H10N 30/50* (2023.01)
*H10N 30/074* (2023.01)
*H10N 30/87* (2023.01)

(52) U.S. Cl.
CPC .......... *H10N 30/50* (2023.02); *H10N 30/074* (2023.02); *H10N 30/872* (2023.02)

(58) Field of Classification Search
None
See application file for complete search history.

(56) References Cited

U.S. PATENT DOCUMENTS

| | | | |
|---|---|---|---|
| 6,066,868 A | 5/2000 | Evans, Jr. | |
| 2001/0010377 A1 | 8/2001 | Cuchiaro | |
| 2003/0062610 A1* | 4/2003 | Kovacs | H01L 23/552 257/E23.137 |
| 2003/0136989 A1* | 7/2003 | Amiotti | H10D 1/696 257/296 |
| 2016/0121610 A1 | 5/2016 | Ashikaga et al. | |
| 2016/0358741 A1 | 12/2016 | Schultz et al. | |

OTHER PUBLICATIONS

Fermin Cuevas, Michel Latroche, Intermetallic alloys as hydrogen getters, Journal of Alloys and Compounds, vol. 905. httos://doi.ora/10.1016/.jallcom.2022.164173. (Year: 2022).*

U.S. Appl. No. 16/531,252, filed Aug. 5, 2019.

(Continued)

*Primary Examiner* — Erica S Lin

(74) *Attorney, Agent, or Firm* — Eschweiler & Potashnik, LLC

(57) ABSTRACT

The present disclosure, in some embodiments, relates to a device. The device includes a first electrode on a substrate, a piezoelectric layer on the first electrode, and a second electrode on the piezoelectric layer. A layer of hydrogen getter material is disposed on the first electrode and is separated from the piezoelectric layer by the first electrode. The layer of hydrogen getter material laterally extends past opposing outermost sidewalls of the first electrode, as viewed in a cross-sectional view.

20 Claims, 16 Drawing Sheets

(56) References Cited

OTHER PUBLICATIONS

Oregon State University. "Advance could change modern electronics: High-performance 'metal-insulator-metal' diode created." Phys.org, published on Oct. 29, 2010.
Wikipedia.org "Atomic Ratio." Published on Jul. 13, 2018.
Wikipedia.org "Diode" Published on Apr. 14, 2019.
Wikipedia.org "Electric Arc." Published on Mar. 30, 2019.
Wikipedia.org "Elemental Analysis." Published on Feb. 26, 2019.
Wikipedia.org "Getter." Published on Apr. 17, 2019.
VAC Aero International. "Getter Materials." Published on Jun. 5, 2017.
Sciencedirect Topics "Getters—An Overview." The date of publication is unknown. Retrieved online on May 6, 2019 from https://www.sciencedirect.com/topics/engineering/getters.
Autodesk. "Feel the Squeeze: How Piezoelectricity Works to Make Crystals Conduct Electric Current." Published in 2016.
Bersuker et al. "Metal oxide resistive random access memory (RRAM) technology." Advances in Non-Volatile Memory and Storage Technology, published in 2014.
Wikipedia.org. "Metal-insulator-metal." Published on Dec. 25, 2018.
Wikipedia.org "Time-dependent gate oxide breakdown." Published on Nov. 27, 2018.
VAC Aero International. "Getter Materials." Published on Jun. 5, 2017. Retrieved online on May 6, 2019 from https://vacaero.com/information-resources/vac-aero-training/1166-getter-materials.html.
Dodd, Simon. "MEMS Piezo Actuators." ST developers Conference, Oct. 4, 2016.
Non-Final Office Action date Jul. 22, 2021 in connection with U.S. Appl. No. 16/531,252.
Non-Final Office Action dated Sep. 15, 2021 for U.S. Appl. No. 16/108,384.
Final Office Action dated Feb. 3, 2022 for U.S. Appl. No. 16/108,384.
Notice of Allowance dated Aug. 3, 2022 for U.S. Appl. No. 16/108,384.
Non-Final Office Action dated Jul. 27, 2023 for U.S. Appl. No. 17/852,970.
Notice of Allowance dated Feb. 7, 2024 for U.S. Appl. No. 17/852,970.
Fermin Cuevas, Michel Latroche, Intermetallic alloys as hydrogen getters, Journal of Alloys and Compounds, vol. 905, https://doi.org/10.1016/j.jallcom.2022.164173. (Year: 2022).

* cited by examiner

PIEZOELECTRIC DEVICE WITH HYDROGEN GETTER

REFERENCE TO RELATED APPLICATIONS

This application is a Continuation of U.S. application Ser. No. 17/852,970, filed on Jun. 29, 2022, which is a Divisional of U.S. application Ser. No. 16/108,384, filed on Aug. 22, 2018 (now U.S. Pat. No. 11,527,702, issued on Dec. 13, 2022), which claims the benefit of U.S. Provisional Application No. 62/696,471, filed on Jul. 11, 2018. The contents of the above-referenced patent applications are hereby incorporated by reference in their entirety.

BACKGROUND

Piezoelectric devices, such as piezoelectric actuators, can be used for creating physical movement of a physical part in a system under the control of an electrical signal. The physical movement generated by a piezoelectric device can be used to control various kinds of mechanical system and optical system. Some types of piezoelectric actuators can be used to create a linear motion or other type of motions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
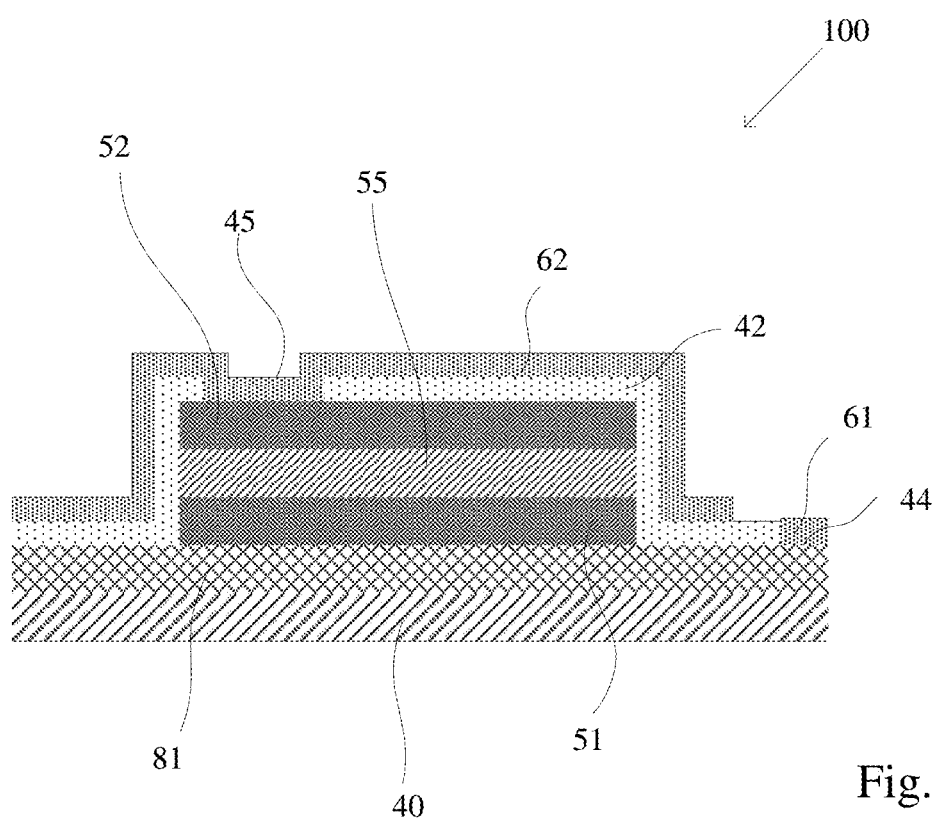
FIG. 1 is a cross-section view of a piezoelectric device having a getter in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A piezoelectric actuator generally includes a piezoelectric layer deposited between two conductive layers. A first electrode is formed in a first conductive layer, and a second electrode formed in a second conductive layer. When a voltage is applied between the first electrode and the second electrode, the electrical field generated by the applied voltage can cause the piezoelectric layer to stretch or compress in a direction normal to the piezoelectric layer. The stretch and compression of the piezoelectric layer is translated into a physical displacement. Such physical displacement can be used to control various kinds of mechanical systems and optical systems. The amount of the physical displacement generally depends upon the voltage applied between the first electrode and the second electrode. While the piezoelectric actuator can convert this applied voltage into a precisely controlled physical displacement, the dynamic range of the physical displacement can depend upon the magnitude of the voltage that can be practically applied between the first electrode and the second electrode. For many practical applications, the voltage to be applied between the first electrode and the second electrode can be relatively high, to achieve the required dynamic range of the physical displacement for the controlled system. Such relatively high voltage can cause reliability problems in the piezoelectric actuator, and can cause the probability of failures to increase during device operation and reliability test. One failure mechanism is due to the existence of hydrogen-ions in piezoelectric material of the piezoelectric device.

When the piezoelectric layer is deposited using a sol-gel process, it's hard to completely eliminate the residual hydrogen-ions without breakdown degradation due to hydrogen-ion induced reduction reaction. During the sol-gel process, hydrogen-ions can easily accumulate in the piezoelectric material or at interfaces between the piezoelectric material and other electrode, and the accumulated hydrogen-ions can induce film delamination and breakdown. The existence of hydrogen-ions in piezoelectric material can also be due to subsequent hydrogen-ion containing processes after the deposition of the piezoelectric layer. Examples of these subsequent hydrogen-ion containing processes include photoresist coating, striping, and cleaning. These subsequent hydrogen-ion containing processes can increase the amount of residual hydrogen-ions in the piezoelectric material and degrade the reliability of the piezoelectric device fabricated from such piezoelectric material.

When a piezoelectric device includes a piezoelectric layer deposited between a first electrode and a second electrode, one of the reasons for reduced reliability of the piezoelectric device is due to the diffusion of the hydrogen-ion in the piezoelectric material under the influence of the electrical field that is generated by the voltage applied between the first electrode and the second electrode. In one example, when the first electrode is connected to a ground and the second electrode is connected to a positive voltage, the hydrogen-ion in the piezoelectric material can drift towards the first electrode, and the accumulated hydrogen-ions in the first electrode can adversely influence the reliability of the piezoelectric device. In another example, when the first electrode is connected to a positive voltage and the second electrode is connected to a ground, the hydrogen-ion in the piezoelectric material can drift towards the second electrode, and the accumulated hydrogen-ions in the second electrode can adversely influence the reliability of the piezoelectric device. It is desirable to improve the reliability of the piezoelectric device even if there are residual hydrogen-ions in the piezoelectric material for fabricating the piezoelectric device.

FIG. 1 is a cross-section view of a piezoelectric device having a getter in accordance with some embodiments. The piezoelectric device 100 includes a substrate 40, a first layer of getter material 81, a first electrode 51, a second electrode 52, an insulator element 55, a first input-output electrode 61, and a second input-output electrode 62. The first layer of getter material 81 is deposited on the substrate 40. The first electrode 51 is formed in a first conductive layer deposited on the first layer of getter material 81. The insulator element 55 is formed in a piezoelectric layer deposited on the first electrode 51. The second electrode 52 is formed in a second conductive layer deposited on the insulator element 55. The first input-output electrode 61 is conductively connected to the first layer of getter material 81, and the second input-output electrode 62 is conductively connected to the second electrode 52.

The getter material 81 used in the piezoelectric device 100 generally has a high getter capability for hydrogen. Examples of possible materials for using in the getter material 81 include Titanium (Ti), Barium (Ba), Cerium (Ce), Lanthanum (La), Aluminum (Al), Magnesium (Mg), and Thorium (Th). The table below lists the getter capability of some materials for hydrogen. The materials listed in the table include Barium (Ba), Cerium (Ce), Lanthanum (La), and Titanium (Ti).

| Getter material | Getter Capability (Pa-l/mg) |
| --- | --- |
| Barium | 11.50 |
| (Cerium, Lanthanum) | 6.13 |
| Titanium | 27.00 |

In FIG. 1, the layered structure of the first electrode 51, the insulator element 55, and the second electrode 52 forms a metal-insulator-metal device. When a voltage is applied between the first input-output electrode 61 and the second input-output electrode 62, the same voltage is applied between the first electrode 51 and the second electrode 52. The electrical field caused by the applied voltage can cause the insulator element 55 to stretch or compress in a direction normal to the surface of the substrate 40. The stretch and compression of the insulator element 55 is translated into a physical displacement for controlling a mechanical system or optical system.

In FIG. 1, when the first input-output electrode 61 is connected to a ground and the second input-output electrode 62 is connected to a positive voltage, the hydrogen-ion in the insulator element 55 formed from a piezoelectric material layer can drift towards the first electrode 51 under the influence of the electrical field that is generated by the voltage applied. Because of the getter material 81 that is in proximity with the first electrode 51, the degrading effects on the piezoelectric device 100 caused by the accumulated hydrogen-ions can be reduced. The reliability of the piezoelectric device 100 can be improved due to the getter material 81. Generally, the larger the getter capability for hydrogen in the getter material 81, the better the protection the getter material 81 can provide for preventing the piezoelectric device 100 from being degraded by the hydrogen-ions in the insulator element 55. In some embodiments, Titanium can be selected as the getter material 81, because of its high getter capability for hydrogen at about 27.0 Pa-l/mg.

FIGS. 2A-2D are cross-section views of device structures for showing one method of manufacturing the piezoelectric device 100 in FIG. 1 in accordance with some embodiments. As shown in a cross-sectional view in FIG. 2A, a substrate 40 is provided. In various embodiments, the substrate 40 can be, for example, silicon, glass, silicon dioxide, aluminum oxide, or the like. A first layer of getter material 81 is formed on the substrate 40 with a deposition process, such as, chemical vapor deposition (CVD), physical vapor deposition (PVD), or atomic layer deposition (ALD). Then, a first conductive layer 31 is deposited on the first layer of getter material 81, a piezoelectric layer 35 is deposited on the first conductive layer 31, and a second conductive layer 32 is deposited on the piezoelectric layer 35. The first conductive layer 31 and the second conductive layer 32 each can be formed with a deposition process, such as, CVD, PVD, or ALD. In some embodiments, the first conductive layer 31 may comprise a different material than the first layer of getter material 81. Examples of the materials for using in the first conductive layer 31 or the second conductive layer 32 include, but are not limited to, molybdenum (Mo), titanium nitride (TiN), aluminum (Al), platinum (Pt), gold (Au), tungsten (W), and the like, and a combination thereof. In some embodiments, the piezoelectric layer 35 can be formed with a sol-gel process. Examples of the materials for using in the piezoelectric layer 35 include, but are not limited to, aluminum nitride (AlN), lead zirconate titanate (PZT), gallium orthophosphate (GaPO$_4$), langasite (La$_3$ Ga·$_5$SiO$_{14}$), barium titanate, barium titanate (BaTiO$_3$), potassium niobate (KNbO$_3$), lithium niobate (LiNbO$_3$), lithium tantalate (LiTaO$_3$), sodium tungstate (Na2WO$_3$), zinc oxide (ZnO) and the like, and a combination thereof.

Figure 2A:
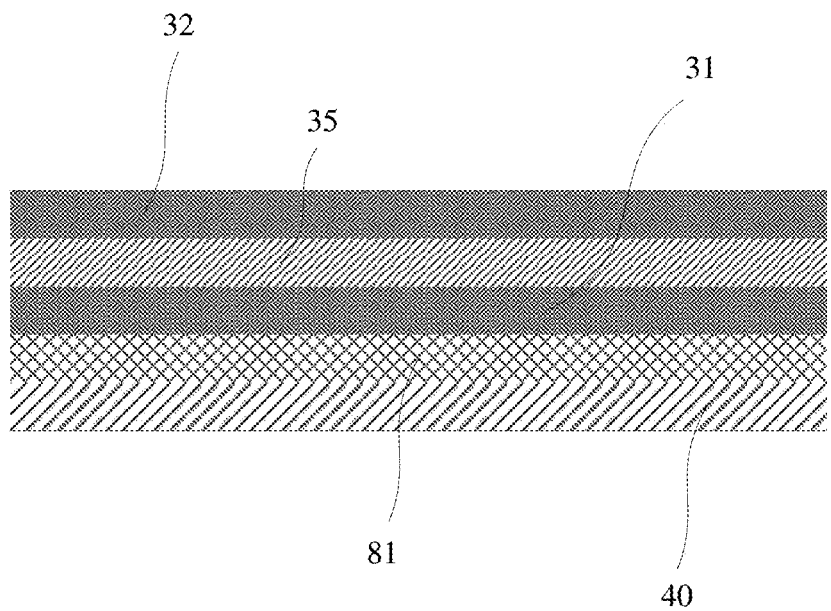
FIGS. 2A-2D are cross-section views of device structures for showing one method of manufacturing the piezoelectric device in FIG. 1 in accordance with some embodiments.
Figure 2B:
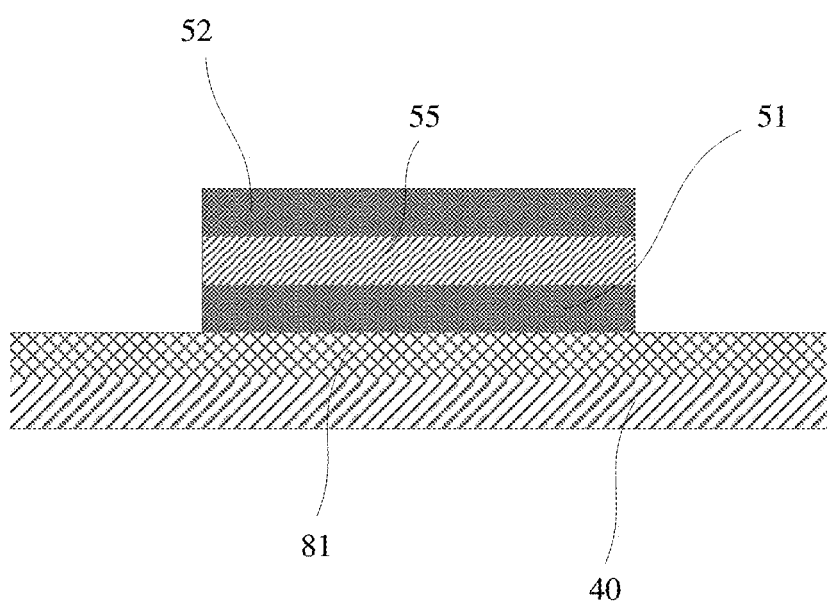

In the next step, as shown in a cross-sectional view in FIG. 2B, there are three layers of materials above the layer of getter material 81. The three layers—the second conductive layer 32, the piezoelectric layer 35, and the first conductive layer 31—are selectively etched according to a pattern as designed to form a metal-insulator-metal device that includes, the second electrode 52, the insulator element 55, and the first electrode 51. In some embodiments, a mask layer with the pattern as designed is formed on top of the second conductive layer 32 before the three layers of materials above the layer of getter material 81 are selectively etched. The mask layer with the pattern as designed can be a layer of patterned photoresist or a layer of dielectric material formed using a photolithography process. In some embodiments, the three layers of materials above the layer of getter material 81 are etched in a directional etching process using a dry etchant. In some embodiments, the last of the three layers of materials—the second conductive layer 32—may be etched using a dry etchant having a high selectivity between the material in the second conductive layer 32 and the getter material 81, so as to form a clean profile at the surface of the layer of getter material 81.

Figure 2C:
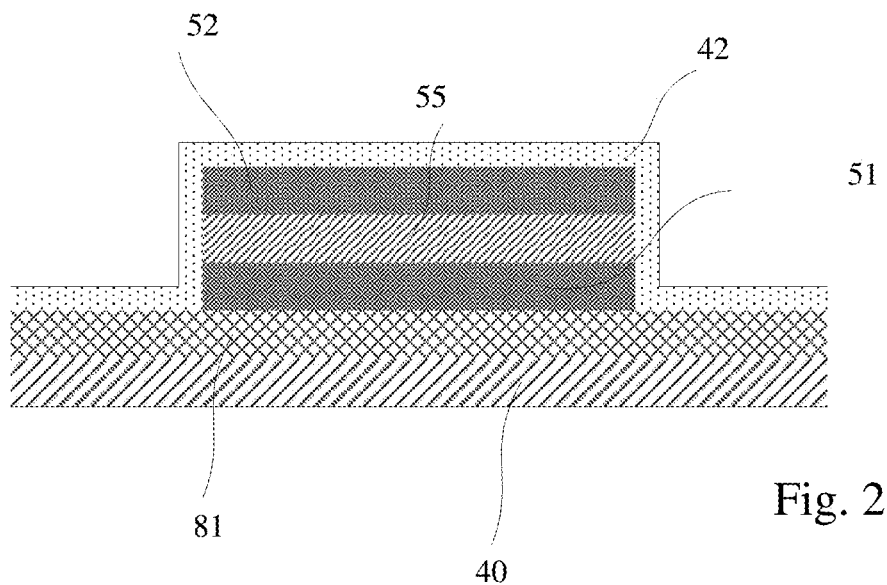

In the next step, as shown in a cross-sectional view in FIG. 2C, a passivation layer 42 is deposited on the second electrode 52 and the exposed part of the getter material 81. The passivation layer 42 also covers the sides of the second electrode 52, the insulator element 55, and the first electrode 51. The passivation layer 42 can be formed with chemical vapor deposition (CVD), physical vapor deposition (PVD), or any other suitable techniques. Examples of materials that can be used for the passivation layer 42 include silicon dioxides and silicon nitrides. Other dielectric materials can also be used for the passivation layer 42.

Figure 2D:
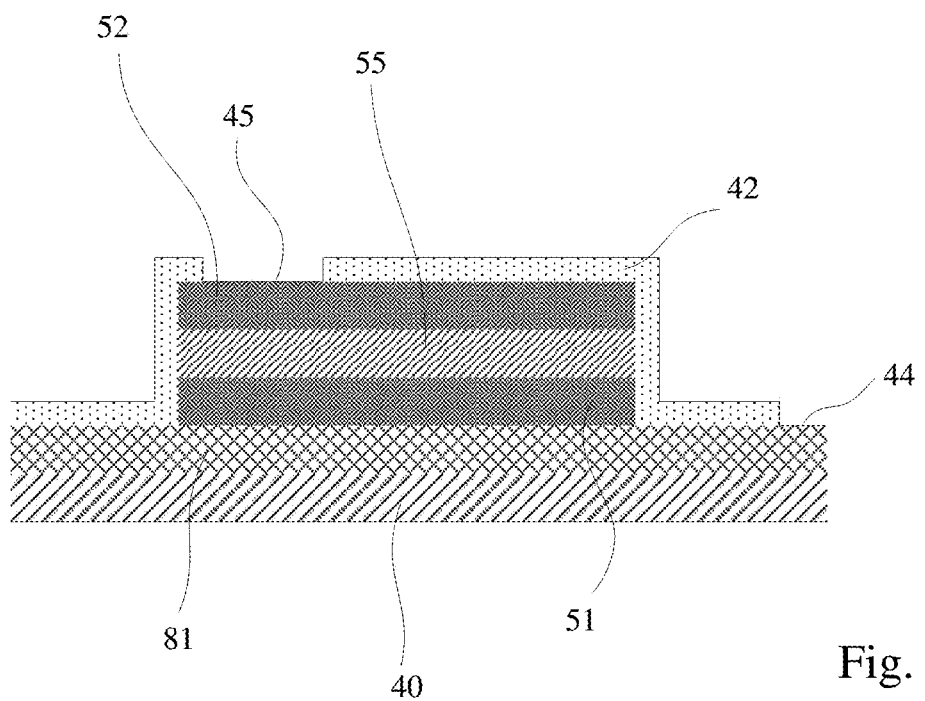

In the next step, as shown in a cross-sectional view in FIG. 2D, a first opening 44 and a second opening 45 are fabricated in the passivation layer 42 respectively for making contacts to the first input-output electrode 61 and to the second input-output electrode 62. These two openings can be fabricated with an etching process after a photoresist layer is patterned on top of the passivation layer 42 using photolithography techniques.

Then, in the next step, as shown in a cross-sectional view in FIG. 1, the first input-output electrode 61 is fabricated to make conductive contact with the first electrode 51 through the first opening 44, and the second input-output electrode 62 is fabricated to make conductive contact with the second electrode 52 through the second opening 45. The first input-output electrode 61 and the second input-output electrode 62 provide the input terminals for receiving the electrical voltage for controlling the physical displacement of this functional piezoelectric device 100.

Figure 3:
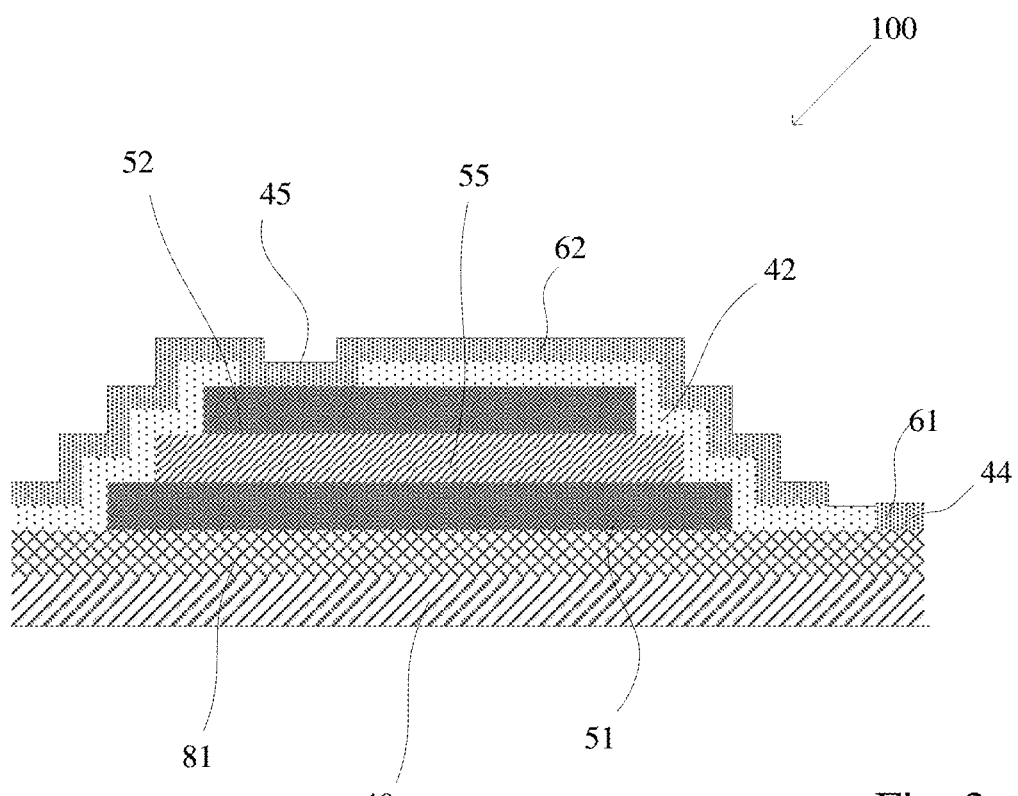
FIG. 3 is a cross-section view of another implementation of a piezoelectric device having a getter in accordance with some embodiments.

FIG. 3 is a cross-section view of another implementation of a piezoelectric device having a getter in accordance with some embodiments. Similar to the piezoelectric device in FIG. 1, the piezoelectric device 100 in FIG. 3 includes a substrate 40, a first layer of getter material 81, a first electrode 51, a second electrode 52, an insulator element 55, a first input-output electrode 61, and a second input-output electrode 62. The second electrode 52, the insulator element 55, and the first electrode 51 form a metal-insulator-metal device both in the device of FIG. 3 and in the device of FIG. 1. The geometric configurations of the metal-insulator-metal device formed, however, are different, in the devices of FIG. 3 and FIG. 1. The second electrode 52, the insulator element 55, and the first electrode 51 in the device of FIG. 1 have substantially identical physical layout. In contrast, the second electrode 52, the insulator element 55, and the first electrode 51 in the device of FIG. 3 each have different physical layouts. As shown in FIG. 3, the insulator element 55 covers a part of the first electrode 51, and the second electrode 52 covers a part of the insulator element 55. As a comparison, in the device of FIG. 1, the insulator element 55 covers the entire upper interface of the first electrode 51, and the second electrode 52 covers the entire upper interface of the insulator element 55.

Similar to the device in FIG. 1, the getter material 81 used in the piezoelectric device 100 in FIG. 3 generally has a high getter capability for hydrogen. Examples of possible materials for using in the getter material 81 include Titanium (Ti), Barium (Ba), Cerium (Ce), Lanthanum (La), Aluminum (Al), Magnesium (Mg), and Thorium (Th). During operation, when the first input-output electrode 61 is connected to a ground and the second input-output electrode 62 is connected to a positive voltage, the hydrogen-ion in the insulator element 55 (which is formed from a piezoelectric material layer) can drift towards the first electrode 51 under the influence of the electrical field that is generated by the voltage applied. Because of the getter material 81 that is in proximity with the first electrode 51, the degrading effects on the piezoelectric device 100 caused by the accumulated hydrogen-ions can be reduced. The reliability of the piezoelectric device 100 can be improved due to the getter material 81.

FIGS. 4A-4D are cross-section views of device structures for showing one method of manufacturing the piezoelectric device 100 in FIG. 3 in accordance with some embodiments. As shown in a cross-sectional view in FIG. 4A, a substrate 40 is provided, and a first layer of getter material 81 is formed on the substrate 40 with a deposition process. Then, a first conductive layer 31 is deposited on the first layer of getter material 81, a piezoelectric layer 35 is deposited on the first conductive layer 31, and a second conductive layer 32 is deposited on the piezoelectric layer 35.

Figure 4A:
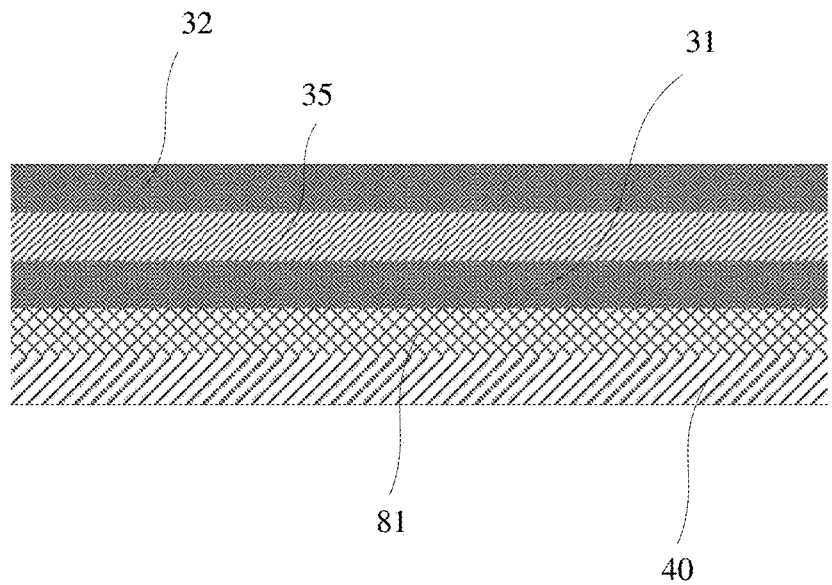
FIGS. 4A-4D are cross-section views of device structures for showing one method of manufacturing the piezoelectric device in FIG. 3 in accordance with some embodiments.
Figure 4B:
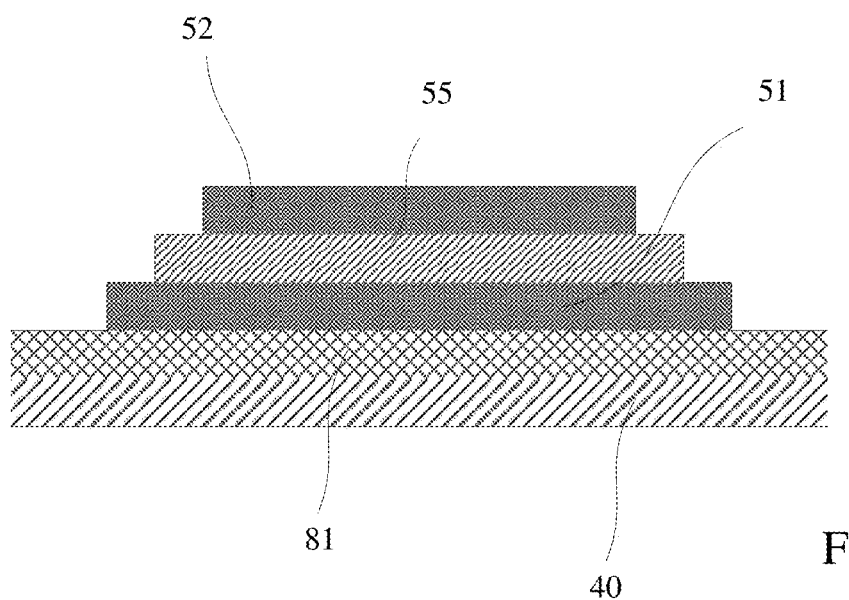

In the next step, as shown in a cross-sectional view in FIG. 4B, there are three layers of materials above the layer of getter material 81. These three layers are the second conductive layer 32, the piezoelectric layer 35, and the first conductive layer 31. These three layers are etched layer by layer to form a metal-insulator-metal device. First, the second conductive layer 32 is etched according to a pattern as designed to form a second electrode 52. Then, the piezoelectric layer 35 is etched according to a pattern as designed to form an insulator element 55. Followed by another etching process, in which the first conductive layer 31 is etched according to a pattern as designed to form a first electrode 51. In some embodiments, each of the design patterns for forming the second electrode 52, the insulator element 55, and the first electrode 51 can be defined by a photoresist mask created with photolithography techniques. After these etching processes, the fabricated metal-insulator-metal device has a staircase shaped stacked-structure.

Figure 4C:
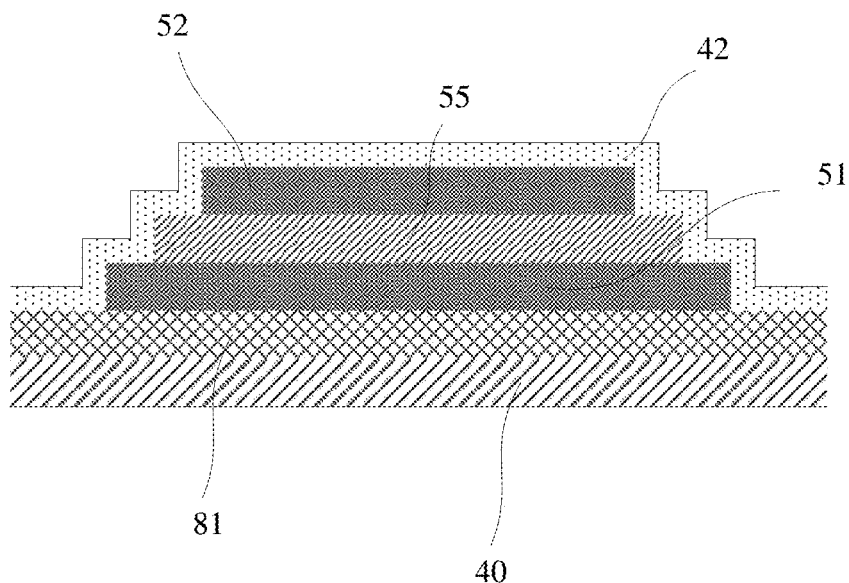

In the next step, as shown in a cross-sectional view in FIG. 4C, a passivation layer 42 is deposited on the second electrode 52, the exposed part of the insulator element 55, the exposed part of the first electrode 51, and the exposed part of the getter material 81. The passivation layer 42 also covers the sides of the second electrode 52, the insulator element 55, and the first electrode 51.

Figure 4D:
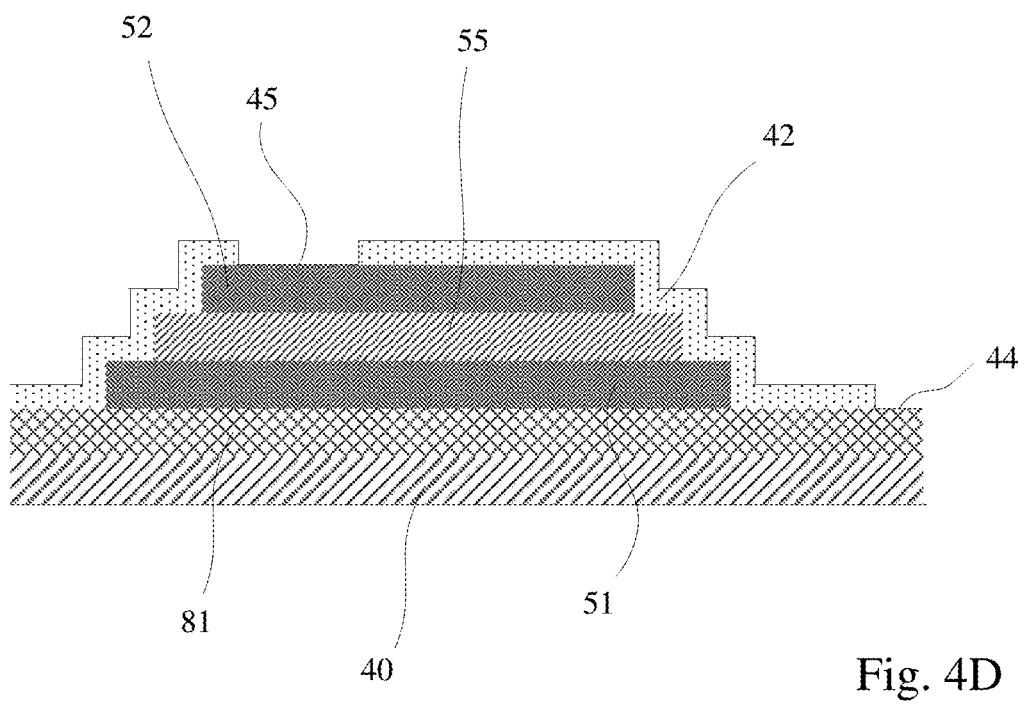

In the next step, as shown in a cross-sectional view in FIG. 4D, a first opening 44 and a second opening 45 are fabricated in the passivation layer 42 respectively for making contacts to the first input-output electrode 61 and to the second input-output electrode 62. Then, in the next step, as shown in a cross-sectional view in FIG. 3, the first input-output electrode 61 is fabricated to make conductive contact with the first electrode 51 through the first opening 44, and the second input-output electrode 62 is fabricated to make conductive contact with the second electrode 52 through the second opening 45. The end product is the piezoelectric device 100 in FIG. 3, which is fabricated with the processes as illustrated in FIGS. 4A-4D.

Figure 5:
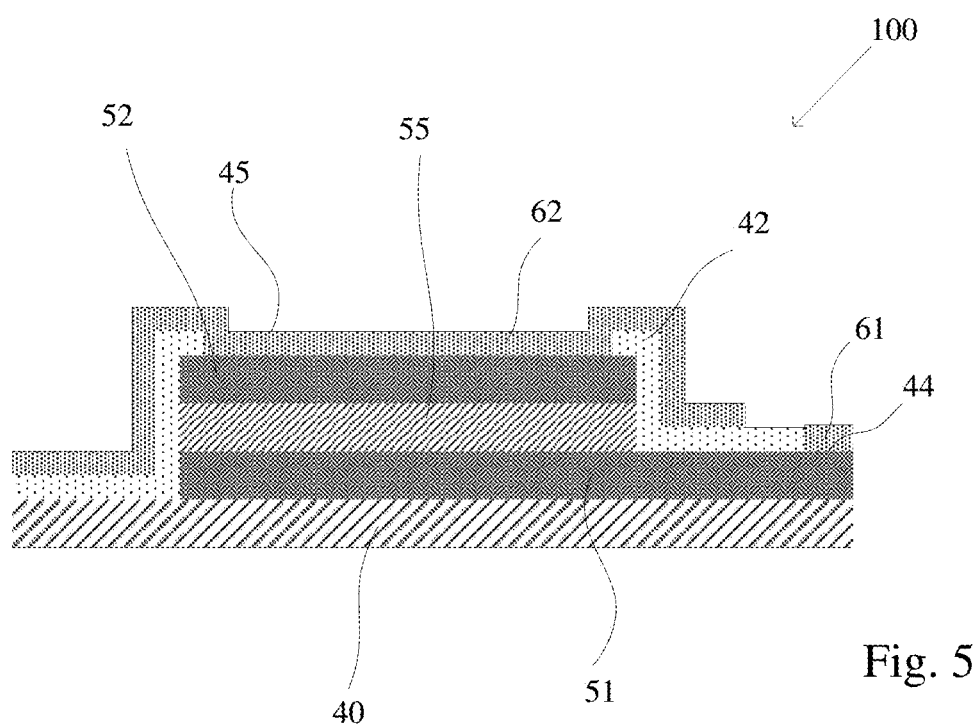
FIG. 5 is a cross-section view of an implementation of a piezoelectric device having a getter in an input-output electrode according to some embodiments.

FIG. 5 is a cross-section view of an implementation of a piezoelectric device having a getter in an input-output electrode according to some embodiments. The piezoelectric device 100 includes a substrate 40, a first electrode 51, a second electrode 52, an insulator element 55, a first input-output electrode 61, and a second input-output electrode 62. The first electrode 51 is formed in a first conductive layer deposited on the substrate 40. The insulator element 55 is formed in a piezoelectric layer deposited on the first electrode 51. The second electrode 52 is formed in a second conductive layer deposited on the insulator element 55. The first input-output electrode 61 is conductively connected to the first electrode 51, and the second input-output electrode 62 is conductively connected to the second electrode 52. The second input-output electrode 62 also functions as a getter, so materials with a high getter capability for hydrogen can be selected for forming the second input-output electrode 62. In some embodiments, the second input-output electrode 62 is formed from a layer of Titanium (Ti). In some embodiments, the second input-output electrode 62 can include getter materials such as Titanium (Ti), Barium (Ba), Cerium (Ce), Lanthanum (La), Aluminum (Al), Magnesium (Mg), Thorium (Th), or their combinations.

During operation, when the first input-output electrode 61 is connected to a positive voltage and the second input-output electrode 62 is connected to a ground, the hydrogen-ion in the insulator element 55 (which is formed from a piezoelectric material layer) can drift towards the second electrode 52 under the influence of the electrical field that is generated by the voltage applied. Because of the getter materials in the second input-output electrode 62, the degrading effects on the piezoelectric device 100 caused by the accumulated hydrogen-ions can be reduced. The reliability of the piezoelectric device 100 can be improved due to the getter materials in the second input-output electrode 62.

FIGS. 6A-6D are cross-section views of device structures for showing one method of manufacturing the piezoelectric device 100 in FIG. 5 in accordance with some embodiments. As shown in a cross-sectional view in FIG. 6A, a substrate 40 is provided, and a first conductive layer 31 is deposited on the substrate 40. Then, a piezoelectric layer 35 is deposited on the first conductive layer 31, and a second conductive layer 32 is deposited on the piezoelectric layer 35.

Figure 6A:
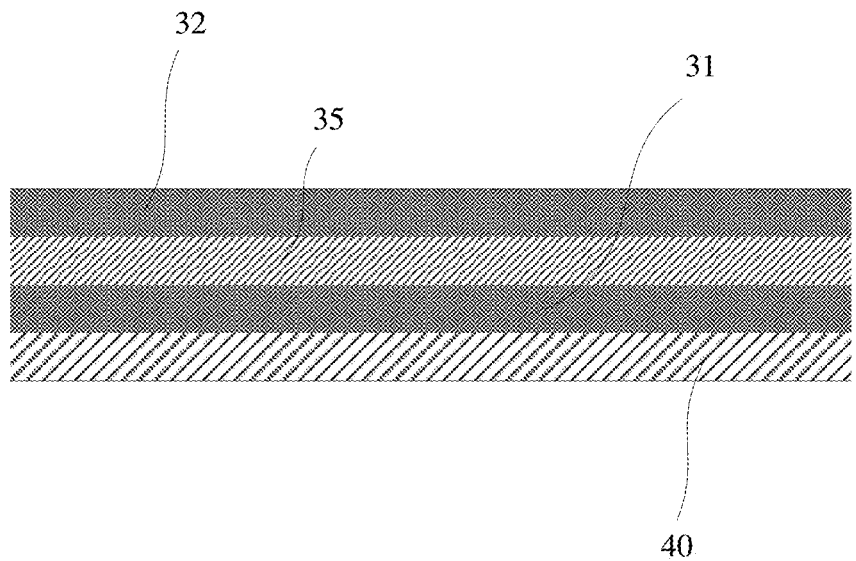
FIGS. 6A-6D are cross-section views of device structures for showing one method of manufacturing the piezoelectric device in FIG. 5 in accordance with some embodiments.
Figure 6B:
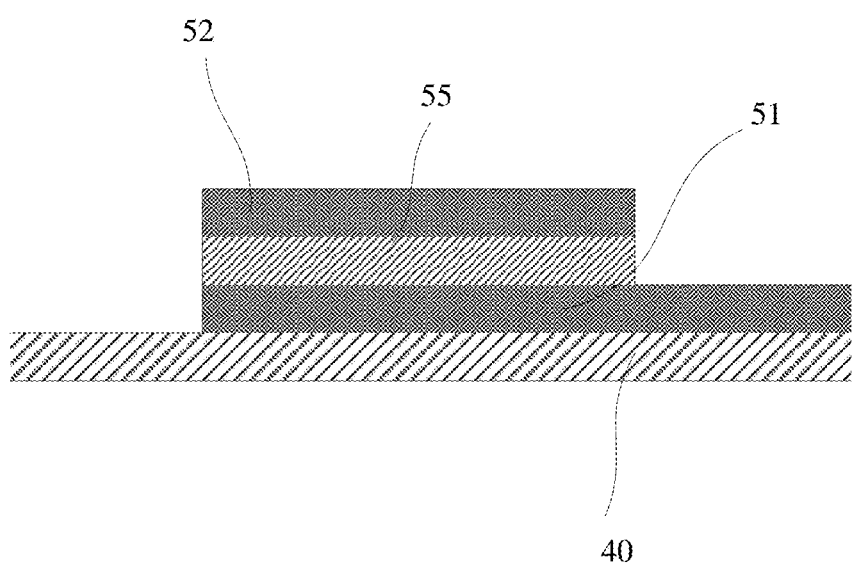

In the next step, as shown in a cross-sectional view in FIG. 6B, the second conductive layer 32, the piezoelectric layer 35, and the first conductive layer 31 are etched to form respectively a second electrode 52, an insulator element 55, and a first electrode 51 of a metal-insulator-metal device.

Figure 6C:
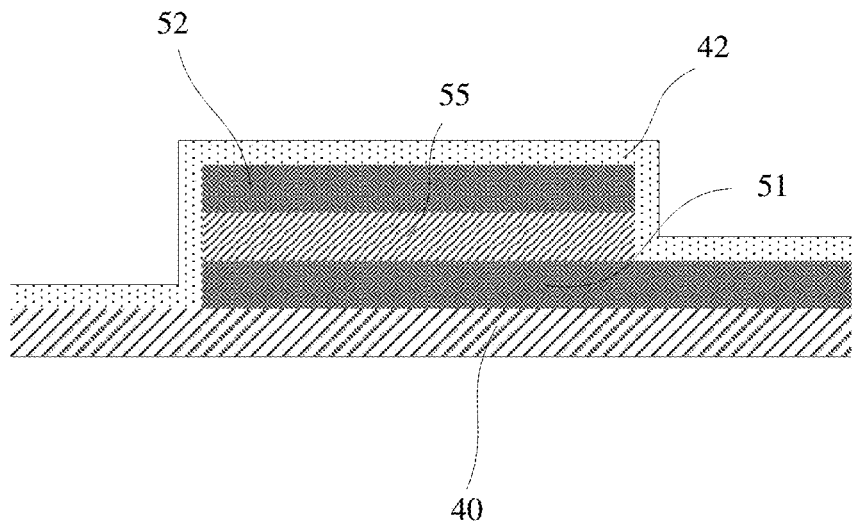

In the next step, as shown in a cross-sectional view in FIG. 6C, a passivation layer 42 is deposited on the second electrode 52 and the exposed part of the first electrode 51. The passivation layer 42 also covers the sides of the second electrode 52, the insulator element 55, and the first electrode 51.

Figure 6D:
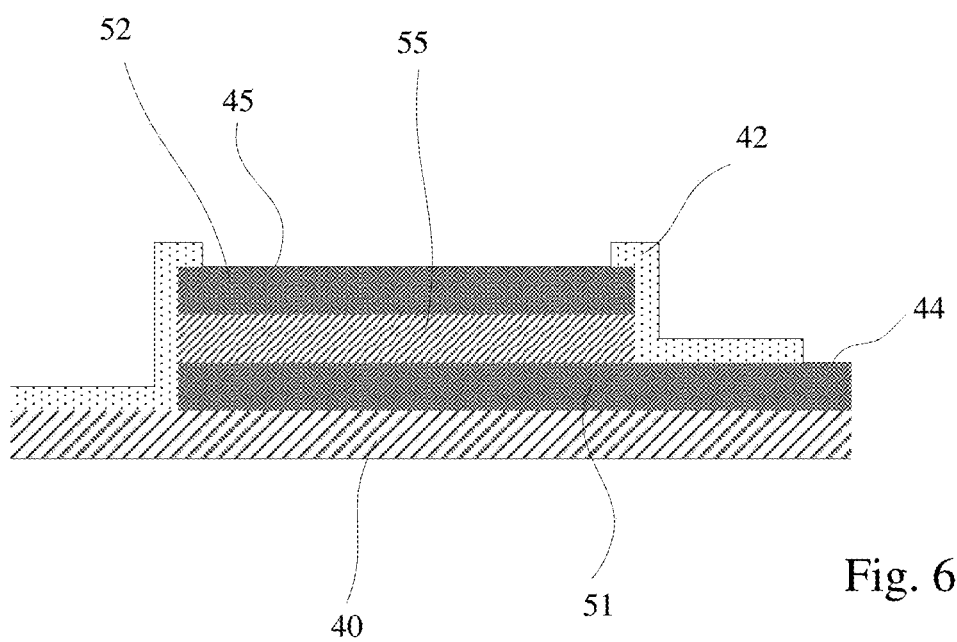

In the next step, as shown in a cross-sectional view in FIG. 6D, a first opening 44 and a second opening 45 are fabricated in the passivation layer 42 respectively for making contacts to the first input-output electrode 61 and to the second input-output electrode 62. Then, in the next step, as shown in a cross-sectional view in FIG. 5, the first input-output electrode 61 is fabricated to make conductive contact with the first electrode 51 through the first opening 44, and the second input-output electrode 62 is fabricated to make conductive contact with the second electrode 52 through the second opening 45. In some embodiments, the second opening 45 is sufficiently large such that the second input-output electrode 62 can have conductive contact with most of the upper surface of the second electrode 52. The end product is the piezoelectric device 100 in FIG. 5, which is fabricated with the processes as illustrated in FIGS. 6A-6D.

Figure 7:
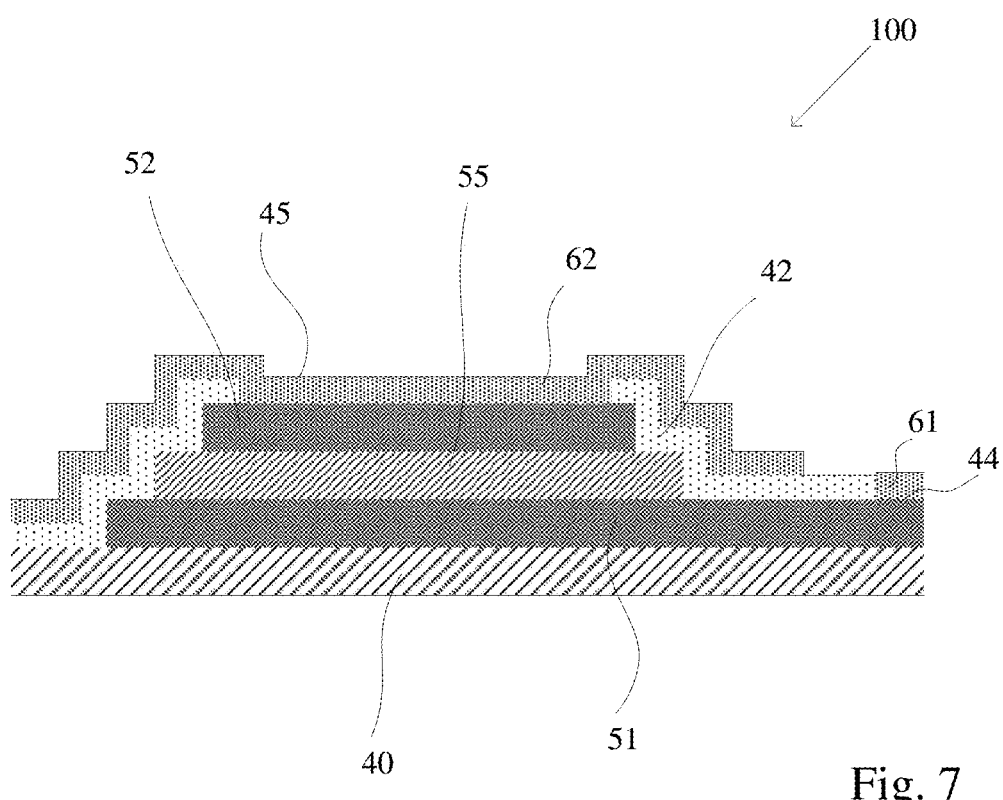
FIG. 7 is a cross-section view of another implementation of a piezoelectric device having a getter in an input-output electrode according to some embodiments.

FIG. 7 is a cross-section view of another implementation of a piezoelectric device having a getter in an input-output electrode according to some embodiments. Similar to the piezoelectric device in FIG. 5, the piezoelectric device 100 in FIG. 7 includes a substrate 40, a first electrode 51, a second electrode 52, an insulator element 55, a first input-output electrode 61, and a second input-output electrode 62 containing getter materials. The second electrode 52, the insulator element 55, and the first electrode 51 form a metal-insulator-metal device both in the device of FIG. 7 and in the device of FIG. 5. The geometric configurations of the metal-insulator-metal device formed, however, are different, in the devices of FIG. 7 and FIG. 5. Additionally, the device of FIG. 7 may have an increased contact area between the second input-output electrode 62 and the upper surface of the second electrode 52, as compared to the device of FIG. 5. Such increased contact area may increase the effectiveness of the second input-output electrode 62 to function as a getter for hydrogen. Examples of the getter materials that can be used in the second input-output electrode 62 include Titanium (Ti), Barium (Ba), Cerium (Ce), Lanthanum (La), Aluminum (Al), Magnesium (Mg), Thorium (Th), or their combinations.

FIGS. 8A-8D are cross-section views of device structures for showing one method of manufacturing the piezoelectric device 100 in FIG. 7 in accordance with some embodiments. As shown in a cross-sectional view in FIG. 8A, a first conductive layer 31 is deposited on a substrate 40, a piezoelectric layer 35 is deposited on the first conductive layer 31, and a second conductive layer 32 is deposited on the piezoelectric layer 35.

Figure 8A:
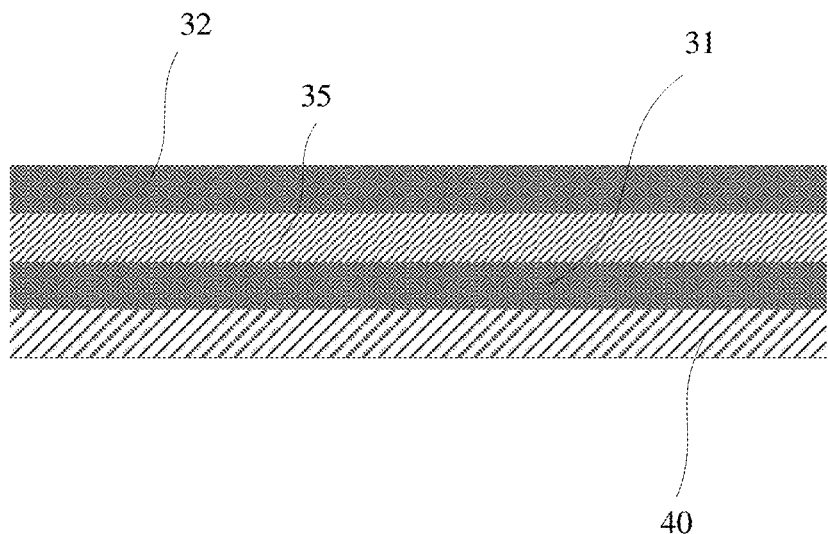
FIGS. 8A-8D are cross-section views of device structures for showing one method of manufacturing the piezoelectric device in FIG. 7 in accordance with some embodiments.
Figure 8B:
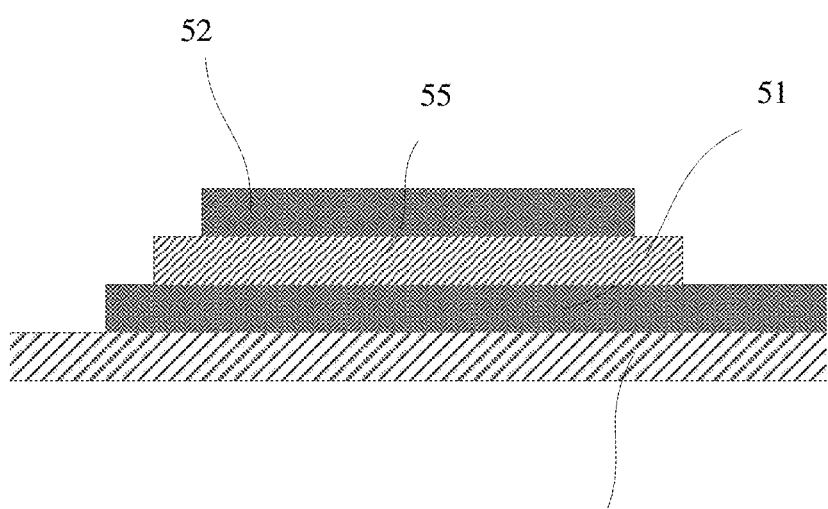

In the next step, as shown in a cross-sectional view in FIG. 8B, the second conductive layer 32, the piezoelectric layer 35, and the first conductive layer 31 are etched to form respectively a second electrode 52, an insulator element 55, and a first electrode 51 of a metal-insulator-metal device.

Figure 8C:
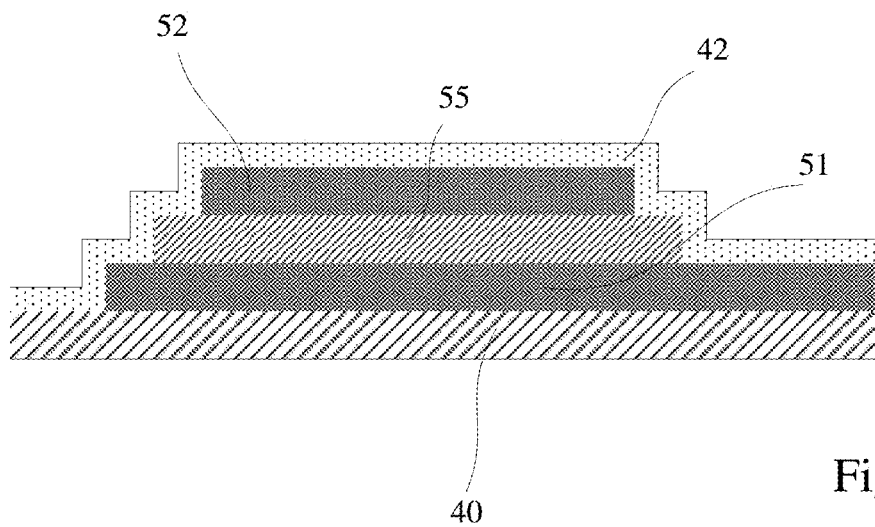

In the next step, as shown in a cross-sectional view in FIG. 8C, a passivation layer 42 is deposited on the second electrode 52, the exposed part of the insulator element 55, and the exposed part of the first electrode 51. The passivation layer 42 also covers the sides of the second electrode 52, the insulator element 55, and the first electrode 51.

Figure 8D:
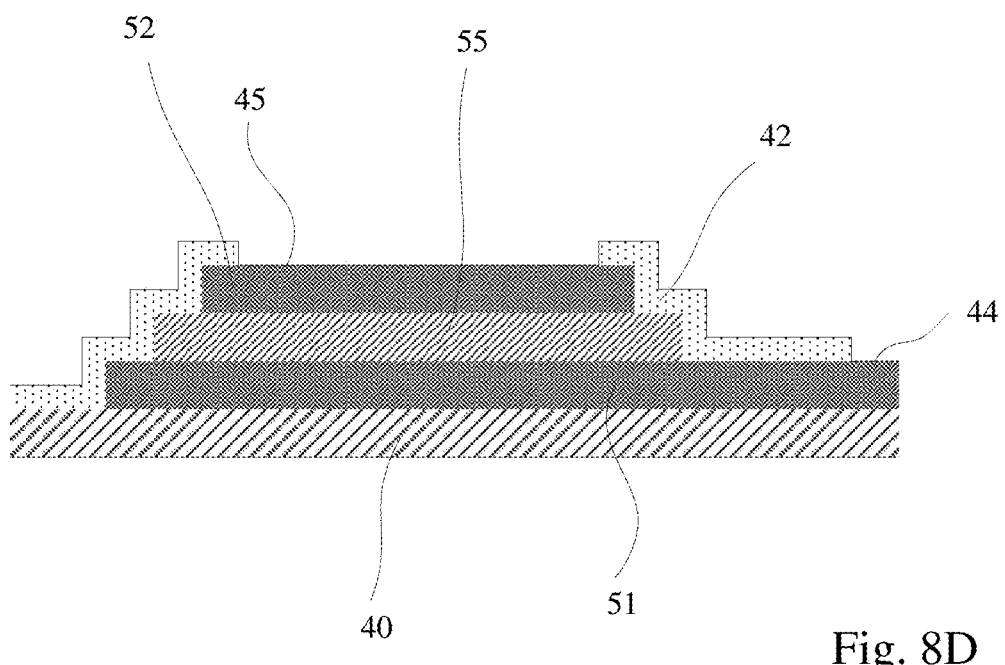

In the next step, as shown in a cross-sectional view in FIG. 8D, a first opening 44 and a second opening 45 are fabricated in the passivation layer 42 respectively for making contacts to the first input-output electrode 61 and to the second input-output electrode 62. Then, in the next step, as shown in a cross-sectional view in FIG. 7, the first input-output electrode 61 is fabricated to make conductive contact with the first electrode 51 through the first opening 44, and the second input-output electrode 62 is fabricated to make conductive contact with the second electrode 52 through the second opening 45. In some embodiments, the second opening 45 is sufficiently large such that the second input-output electrode 62 can have conductive contact with most of the upper surface of the second electrode 52. The end product is the piezoelectric device 100 in FIG. 7, which is fabricated with the processes as illustrated in FIGS. 8A-8D.

FIGS. 9-12 are cross-section views of multiple implementations of a piezoelectric device that has a layer of getter martial deposited after the deposition of the piezoelectric layer in accordance with some embodiments.

Figure 9:
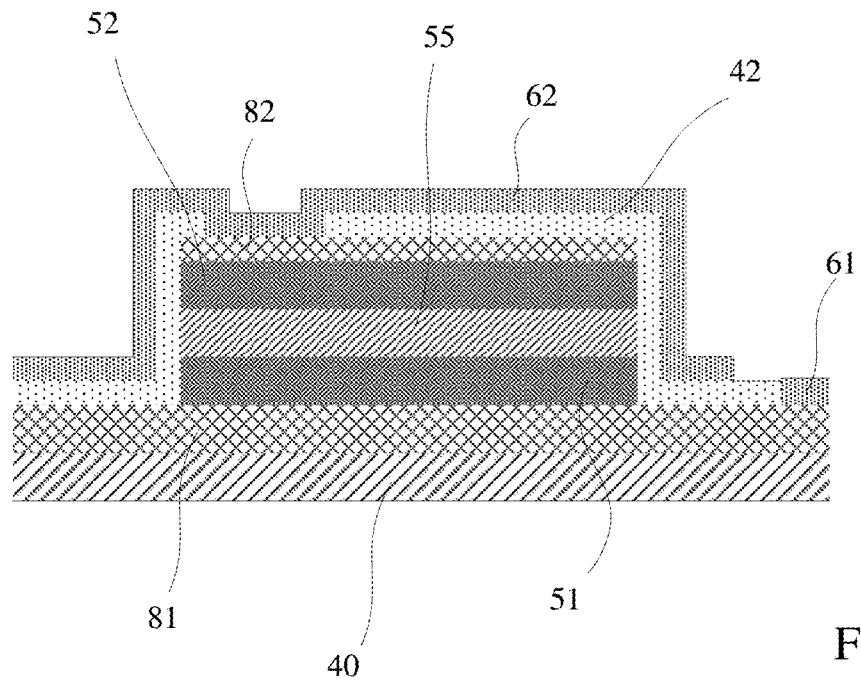
FIGS. 9-12 are cross-section views of multiple implementations of a piezoelectric device that has a layer of getter martial deposited after the deposition of the piezoelectric layer in accordance with some embodiments.
Figure 10:
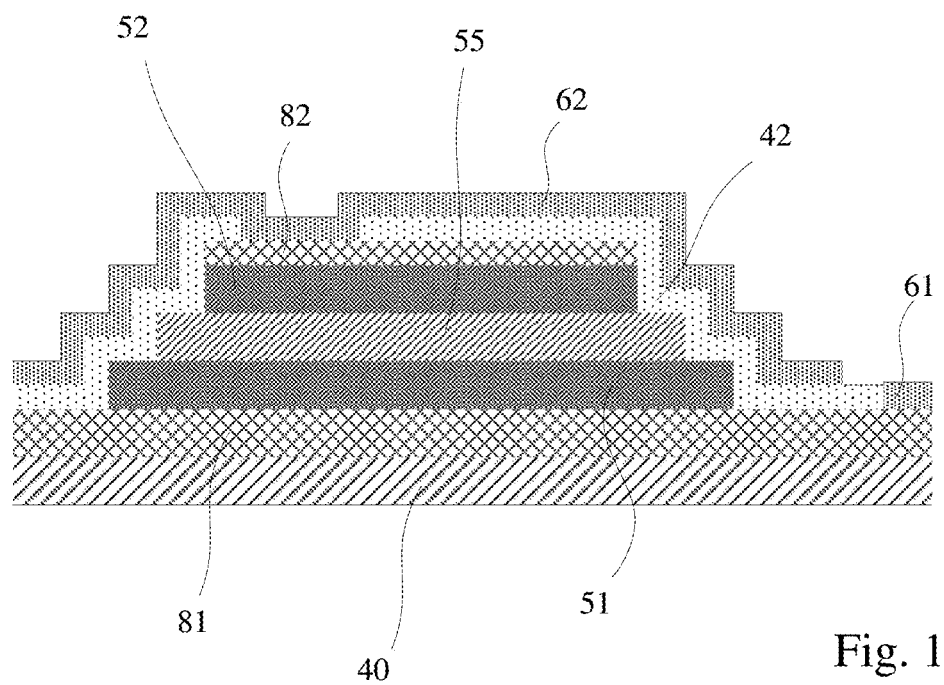

In FIGS. 9-10, the piezoelectric device 100 includes a substrate 40, a first layer of getter material 81, a first electrode 51, a second electrode 52, an insulator element 55, a second layer of getter material 82, a first input-output electrode 61, and a second input-output electrode 62. The first layer of getter material 81 is deposited on the substrate 40. The first electrode 51 is formed in a first conductive layer deposited on the first layer of getter material 81. The insulator element 55 is formed in a piezoelectric layer deposited on the first electrode 51. The second electrode 52 is formed in a second conductive layer deposited on the insulator element 55. The second layer of getter material 82 is deposited on the second electrode 52. The first input-output electrode 61 is conductively connected to the first layer of getter material 81, and the second input-output electrode 62 is conductively connected to the second layer of getter material 82. One of the differences between the device in FIG. 9 and the device in FIG. 10 is that the fabricated metal-insulator-metal device in FIG. 10 has a staircase shaped stacked-structure.

In some embodiments, the first layer of getter material 81 and the second layer of getter material 82 are formed by same getter material. In some embodiments, the first layer of getter material 81 and the second layer of getter material 82 are formed by different getter materials. In some embodiments, the first layer of getter material 81 may comprise a different material than the first electrode 51 and/or the second layer of getter material 82 may comprise a different material than the second electrode 52.

Figure 11:
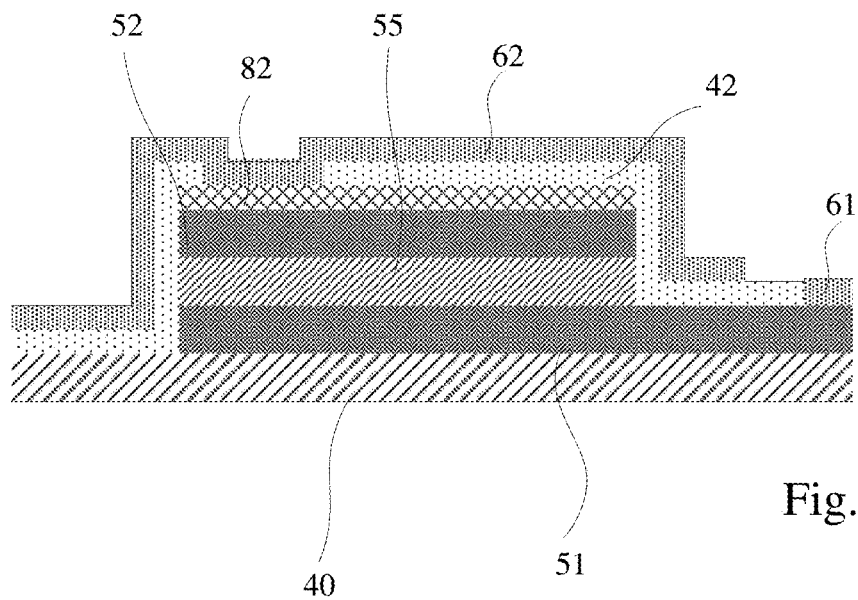
Figure 12:
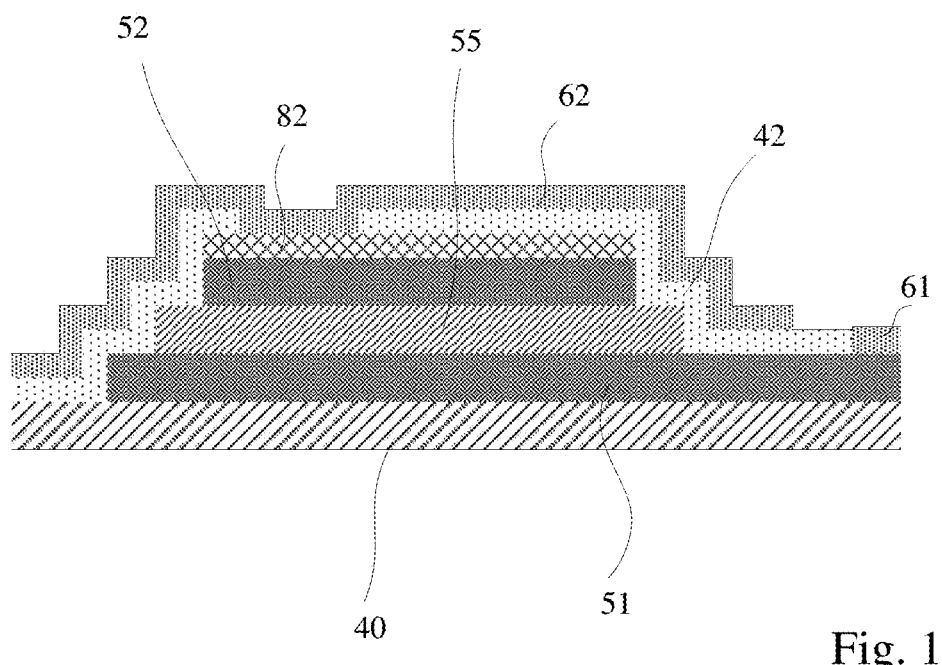

In FIGS. 11-12, the piezoelectric device 100 includes a substrate 40, a first electrode 51, a second electrode 52, an insulator element 55, a layer of getter material 82, a first input-output electrode 61, and a second input-output electrode 62. The first electrode 51 is formed in a first conductive layer deposited on the substrate 40. The insulator element 55 is formed in a piezoelectric layer deposited on the first electrode 51. The second electrode 52 is formed in a second conductive layer deposited on the insulator element 55. The layer of getter material 82 is deposited on the second electrode 52. The first input-output electrode 61 is conductively connected to the first electrode 51, and the second input-output electrode 62 is conductively connected to the layer of getter material 82. One of the differences between the device in FIG. 11 and the device in FIG. 12 is that the fabricated metal-insulator-metal device in FIG. 12 has a staircase shaped stacked-structure.

In FIG. 1, FIG. 3, and FIGS. 9-10, each of the piezoelectric device 100 as shown includes a first layer of getter material 81. In some embodiments, the getter material in the first layer of getter material 81 has a getter capacity larger than 1 Pa-l/mg for hydrogen. In some embodiments, the getter material has a getter capacity larger than 5 Pa-l/mg for hydrogen. In some embodiments, the getter material has a getter capacity larger than 10 Pa-l/mg for hydrogen. In some embodiments, the getter material has a getter capacity larger than 20 Pa-l/mg for hydrogen. In some embodiments, the first layer of getter material 81 has a thickness that is in a range from 200 A to 5000 A.

In FIG. 5, FIG. 7, and FIGS. 11-12, each of the piezoelectric device 100 as shown includes a second input-output electrode 62 that functions as a getter. In some embodiments, the getter material in the second input-output electrode 62 has a getter capacity larger than 1 Pa-l/mg for hydrogen. In some embodiments, the getter material has a getter capacity larger than 5 Pa-l/mg for hydrogen. In some embodiments, the getter material has a getter capacity larger than 10 Pa-l/mg for hydrogen. In some embodiments, the getter material has a getter capacity larger than 20 Pa-l/mg for hydrogen. In some embodiment, the second input-output electrode 62 has a thickness that is in a range from 200 A to 5000 A.

In FIGS. 9-12, each of the piezoelectric device 100 as shown includes the layer of getter material 82. In some embodiments, the getter material in the layer of getter material 82 has a getter capacity larger than 1 Pa-l/mg for hydrogen. In some embodiments, the getter material has a getter capacity larger than 5 Pa-l/mg for hydrogen. In some embodiments, the getter material has a getter capacity larger than 10 Pa-l/mg for hydrogen. In some embodiments, the getter material has a getter capacity larger than 20 Pa-l/mg for hydrogen. In some embodiments, the layer of getter material 82 has a thickness that is in a range from 200 A to 5000 A.

Figure 13:
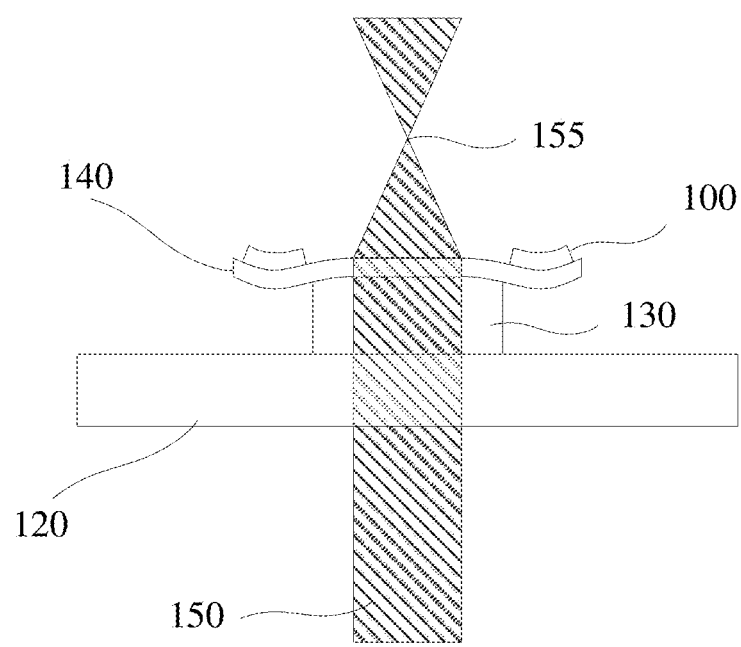
FIG. 13 is a schematic illustrating one example application of the piezoelectric device in accordance with some embodiments.

FIG. 13 is a schematic illustrating one example application of the piezoelectric device in accordance with some embodiments. In FIG. 13, one or more piezoelectric device 100 are used for controlling a variable focus optical system. The variable focus optical system includes a glass substrate 120 and a glass membrane 140. The position of the glass membrane 140 and/or the shape of the glass membrane 140 can be controlled by the piezoelectric device 100. In some embodiments, transparent fluid 130 with well defined optical index can be used to fill up the space between the glass substrate 120 and the glass membrane 140. A beam of light 150, after passing through the glass substrate 120, transparent fluid 130, and the glass membrane 140, gets focused at a focus point 155. When a controlling electrical signal is applied to the piezoelectric device 100, the induced physical displacement of the piezoelectric device 100 will change the position and/or the shape of the glass membrane 140, which will change the position of the focus point 155. In some embodiments, the variable focus optical system may be comprised within a package of a semiconductor chip having one or more image sensors. For example, in some embodiments, the variable focus optical system may be configured to focus light onto an integrated chip having one or more image sensing devices (e.g., CMOS image sensors, CCD image sensors, etc.).

It will be appreciated that the variable focus optical system shown in FIG. 13 is one example usage of the piezoelectric device 100 as described in the instant disclosure. People skilled in the art can find other usage of the piezoelectric device 100 for controlling optical or mechanical systems.

Figure 14:
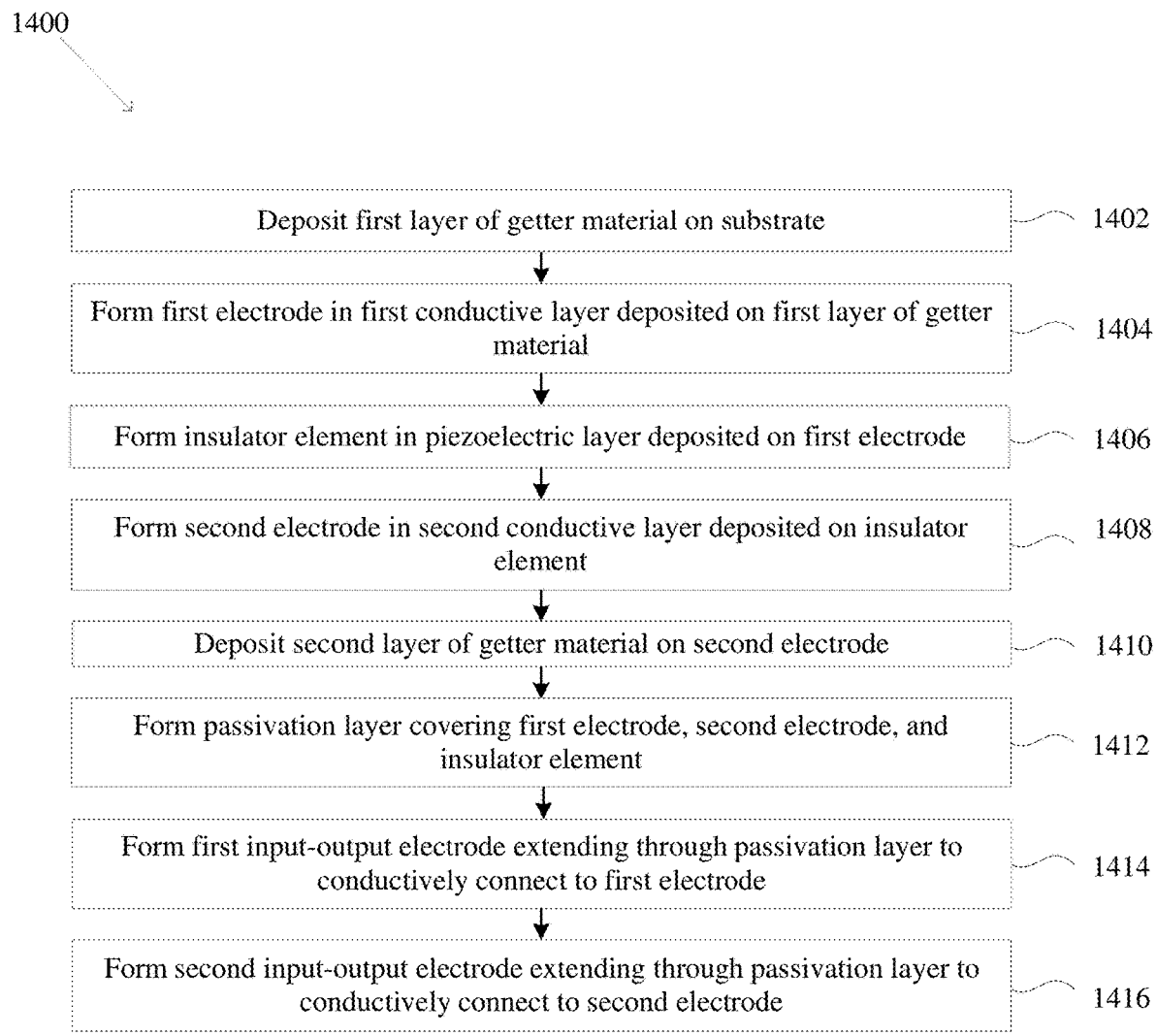
FIG. 14 illustrates a flow diagram of some embodiments of a method of forming a piezoelectric device having a getter in accordance with some embodiments.

FIG. 14 illustrates a flow diagram of some embodiments of a method 1400 of forming a piezoelectric device having a getter in accordance with some embodiments.

While method 1400 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1402, a first layer of getter material may be deposited onto a substrate. FIGS. 2A and 4A illustrate cross-sectional views of some embodiments corresponding to act 1402.

At 1404, a first electrode is formed in a first conductive layer deposited on the first layer of getter material. FIGS.

2A-2B, 4A-4B, 6A-6B, and 8A-8B illustrate cross-sectional views of some embodiments corresponding to act 1404.

At 1406, an insulator element is formed in a piezoelectric layer deposited on the first electrode. FIGS. 2A-2B, 4A-4B, 6A-6B, and 8A-8B illustrate cross-sectional views of some embodiments corresponding to act 1406.

At 1408, a second electrode is formed in a second conductive layer deposited on the insulator element. FIGS. 2A-2B, 4A-4B, 6A-6B, and 8A-8B illustrate cross-sectional views of some embodiments corresponding to act 1408.

At 1410, a second layer of getter material may be deposited onto the second electrode. FIGS. 9-12 illustrate cross-sectional views of some embodiments corresponding to act 1410. It will be appreciated that in various embodiments, the first layer of getter material may be deposited (at 1402) while the second layer of getter material is not deposited, the second layer of getter material may be deposited (at 1410) while the first layer of getter material is not deposited, or the first layer of getter material and the second layer of getter material may both be deposited at 1402 and 1410).

At 1412, a passivation layer is formed covering the first electrode, the second electrode, and the insulator element. FIGS. 2C, 4C, 6C, and 8C illustrate cross-sectional views of some embodiments corresponding to act 1412.

At 1414, a first input-output electrode may be formed that extends through the passivation layer to conductively connect to the first electrode. FIGS. 1, 3, 5, and 7 illustrate cross-sectional views of some embodiments corresponding to act 1414.

At 1416, a second input-output electrode may be formed that extends through the passivation layer to conductively connect to the second electrode. FIGS. 1, 3, 5, and 7 illustrate cross-sectional views of some embodiments corresponding to act 1416.

Some aspects of the present disclosure relate to a piezoelectric device. The device includes a substrate, a first layer of getter material, a first electrode, an insulator element, a second electrode, a first input-output electrode, and a second input-output electrode. The first layer of getter material is deposited on the substrate. The first electrode is formed in a first conductive layer deposited on the first layer of getter material. The first layer of getter material has a getter capacity for hydrogen that is higher than the first electrode. The insulator element is formed in a piezoelectric layer deposited on the first electrode. The second electrode is formed in a second conductive layer deposited on the insulator element. The first input-output electrode is conductively connecting to the first layer of getter material. The second input-output electrode is conductively connecting to the second electrode.

Other aspects of the present disclosure relate to a piezoelectric device. The device includes a substrate, a first electrode, an insulator element, a second electrode, a first input-output electrode, a second input-output electrode, and a layer of getter material. The first electrode is formed in a first conductive layer deposited on the substrate. The insulator element in a piezoelectric layer is deposited on the first electrode. The second electrode is formed in a second conductive layer deposited on the insulator element. The first input-output electrode is conductively connecting to the first electrode. The second input-output electrode is conductively connecting to the second electrode. The layer of getter material is deposited on the second electrode and has a greater getter capacity for hydrogen than the second electrode.

Other aspects of the present disclosure relate to a method of manufacturing a piezoelectric device. The method includes depositing a first layer of getter material on a substrate. The method includes forming a first electrode in a first conductive layer deposited on the first layer of getter material. The method includes forming an insulator element in a piezoelectric layer deposited on the first electrode. The method includes forming a second electrode formed in a second conductive layer deposited on the insulator element. The method includes forming a first input-output electrode that is conductively connected to the first layer of getter material. The method includes forming a second input-output electrode that is conductively connected to the second electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a first electrode on a substrate;
   a piezoelectric layer on the first electrode;
   a second electrode on the piezoelectric layer; and
   a layer of hydrogen getter material disposed on the first electrode and separated from the piezoelectric layer by the first electrode, wherein the layer of hydrogen getter material extends laterally past both sidewalls of the first electrode, as viewed in a cross-sectional view.

2. The device of claim 1, wherein the first electrode and the piezoelectric layer have equal widths.

3. The device of claim 1, further comprising:
   a first conductor on the layer of hydrogen getter material; and
   a second conductor on the second electrode, wherein the second conductor continuously extends from directly over the first electrode and the second electrode to along opposing sides of the piezoelectric layer.

4. The device of claim 1, further comprising:
   a first conductor on the layer of hydrogen getter material; and
   a second conductor on the second electrode, wherein a bottommost surface of the second conductor is above a top of the layer of hydrogen getter material.

5. The device of claim 1, further comprising:
   a first conductor physically contacting the layer of hydrogen getter material.

6. The device of claim 1, wherein the layer of hydrogen getter material includes titanium, barium, cerium, lanthanum, aluminum, magnesium, or thorium.

7. The device of claim 1, further comprising:
   a first conductor having a bottommost surface that is directly over the layer of hydrogen getter material, the bottommost surface being laterally outside of the first electrode.

8. The device of claim 1, wherein the piezoelectric layer includes aluminum nitride, lead zirconate titanate, gallium orthophosphate, angasite, barium titanate, potassium niobate, lithium niobate, lithium tantalate, sodium tungstate, or zinc oxide.

9. A device, comprising:
a first electrode over a substrate;
a piezoelectric layer over the first electrode;
a second electrode over the piezoelectric layer;
a layer of getter material disposed between the first electrode and the substrate;
a first conductor disposed on an upper surface of the layer of getter material and having an outermost sidewall that laterally faces the first electrode and that is laterally outside of the first electrode in a cross-sectional view; and
a second conductor disposed on an upper surface of the second electrode.

10. The device of claim 9, further comprising:
a passivation layer disposed on the layer of getter material, the passivation layer laterally separating the first conductor from the first electrode.

11. The device of claim 9, wherein the first conductor physically contacts the upper surface of the layer of getter material.

12. The device of claim 9, wherein the layer of getter material has a getter capability for hydrogen at greater than or equal to about 10.0 Pa-l/mg.

13. The device of claim 9, wherein the layer of getter material continuously extends to directly below bottommost surfaces of both the first conductor and the second conductor.

14. The device of claim 9, further comprising:
a passivation layer arranged along opposing sides of the first electrode and vertically contacting the layer of getter material along the opposing sides of the first electrode.

15. The device of claim 9, wherein the first electrode, the second electrode, and the piezoelectric layer have different widths and collectively form a pyramidal structure.

16. A device, comprising:
a first electrode over a substrate;
a second electrode over the substrate;
a piezoelectric layer between the first electrode and the second electrode;
a layer of getter material disposed on the second electrode; and
a conductor disposed over the first electrode, the second electrode, and the piezoelectric layer, the conductor continuously extending from over the piezoelectric layer to below a top of the piezoelectric layer on opposite sides of the piezoelectric layer in a cross-sectional view.

17. The device of claim 16, further comprising:
a passivation layer disposed over and extending along sidewalls of the first electrode, the second electrode, and the piezoelectric layer, wherein the passivation layer contacts an upper surface of the layer of getter material on opposing sides of the first electrode.

18. The device of claim 16, wherein the layer of getter material and the first electrode have equal widths.

19. The device of claim 16, wherein the layer of getter material completely covers an entire surface of the first electrode that faces away from the piezoelectric layer.

20. The device of claim 16, wherein the layer of getter material laterally extends in opposing directions past the second electrode.

* * * * *